(12) United States Patent
Yutani et al.

(10) Patent No.: US 6,207,067 B1
(45) Date of Patent: Mar. 27, 2001

(54) METHOD FOR FABRICATING OXIDE SUPERCONDUCTING DEVICE

(75) Inventors: Naoki Yutani; Katsumi Suzuki; Youichi Enomoto; Jian-Guo Wen, all of Tokyo (JP)

(73) Assignees: Mitsubishi Denki Kabushiki Kaisha; International Superconductivity Technology Center, both of Tokyo (JP)

( * ) Notice: Subject to any disclaimer, the term of this patent is extended or adjusted under 35 U.S.C. 154(b) by 0 days.

(21) Appl. No.: 09/161,697

(22) Filed: Sep. 29, 1998

(30) Foreign Application Priority Data

Sep. 30, 1997 (JP) ..................................................... 9-265800

(51) Int. Cl.$^7$ ............................... C23F 1/00; H01L 39/24
(52) U.S. Cl. .............................. 216/3; 505/325; 505/329; 505/410; 505/728
(58) Field of Search .................... 216/3, 66; 505/329, 505/410, 728

(56) References Cited

U.S. PATENT DOCUMENTS

| | | | |
|---|---|---|---|
| 5,223,109 | * | 6/1993 | Itoch et al. ........................ 204/192.34 |
| 5,571,778 | * | 11/1996 | Fujimoto et al. ...................... 505/329 |
| 5,629,232 | * | 5/1997 | Jiang .................................... 438/40 |

FOREIGN PATENT DOCUMENTS

| | | |
|---|---|---|
| 06151986 | 5/1994 | (JP) . |
| 07094790 | 4/1995 | (JP) . |
| 10004222 | 1/1998 | (JP) . |

* cited by examiner

*Primary Examiner*—Randy Gulakowski
*Assistant Examiner*—Michael Kornakov
(74) *Attorney, Agent, or Firm*—Sughrue, Mion, Zinn, Macpeak & Seas, PLLC

(57) ABSTRACT

A method for fabricating an oxide superconducting device includes the steps of: forming a V-shaped groove on a substrate by a converging ion beam and forming a barrier with reduced superconductivity on the oxide superconducting thin-film on the groove to form a Josephson Junction, wherein the irradiation ion amount of the converging ion beam is varied according to the position of the beam within the groove in such a manner that an inclination angle of the inclined portion of the substrate is fixed. An oxide superconducting device (a Josephson Junction device) having a high degree of flexibility in arrangement and with high reproducibility, and having a high degree of uniformity is provided.

5 Claims, 13 Drawing Sheets

METHOD FOR FABRICATING OXIDE SUPERCONDUCTING DEVICE

BACKGROUND OF THE INVENTION

1. Field of the Invention

The present invention relates to a method for fabricating an oxide superconducting device (a Josephson Junction device) using an oxide superconductor.

2. Description of the Related Art

Characteristics of a Josephson Junction are high-speed processing and low power consumption. Among these benefits the low power consumption provides a great benefit when a lot of devices are integrated. Reproducibility and uniformity of the device characteristics are necessary in order to realize a desired design performance.

As methods for fabricating a Josephson Junction as the basics of an oxide superconducting device the following methods are known:

(a) a method for fabricating graded-step-type junctions, in which a graded-step with several hundreds of nm height is formed on a substrate using a conventional photolithography technique and an ion beam such as Ar, or using a reactive ion etching, and in which a weak link of an oxide superconducting thin-film introduced at the graded-step portion is utilized;

(b) a method for fabricating grain boundary-type junctions, using a bi-crystal substrate;

(c) a method for fabricating ramp-edge-type junctions, in which a lower superconducting thin-film is first formed and a graded-step is constructed thereon using a photolithography technique; in the graded-step portion, a barrier layer is formed between the lower thin-film and an upper superconducting thin-film formed afterward; and (d) a method for fabricating plane-type junctions, in which a deteriorated region is formed on a substrate using a converging ion beam (See for example, Japanese Patent Laid-Open No. 6-151986), or a micro groove is formed on a substrate, to utilize a weak link region of an oxide superconducting thin-film generated in the beam irradiation region.

Of these fabricating methods, the method for fabricating grain boundary-type junctions using a bi-crystal substrate mentioned in (b) is not suited for producing an integrated circuit because the position where the Josephson Junction is constructed is limited to the region where the bi-crystal joins together, so that it is difficult to arrange freely a lot of junctions on a substrate. With regard to the method for fabricating ramp-edge-type junctions mentioned in (c) there are disadvantages such as complexity of the fabricating procedure and difficulty in avoiding deterioration in the superconductivity during the procedure. With regard to the method for fabricating graded-step-type junctions mentioned in (a) and the method for fabricating plane-type junctions using a converging ion beam mentioned in (d) the procedure is simple and the degree of freedom for arrangement of junctions is high. The method mentioned in (d) using a converging ion beam is more advantageous than the method mentioned in (a) using photolithography when realizing an integrated circuit, because the method mentioned in (d) makes it possible to construct junctions in a smaller micro region than the method mentioned in (a).

Referring to the drawings, a method for fabricating junctions by forming a groove on a micro region of a substrate using a conventional converging ion beam will be described.

FIG. 9 is a plan view showing a diagrammatic sketch of the construction of a conventional junction. FIG. 10 is a cross-sectional view of the conventional junction taken along the line A–A' of FIG. 9. In FIGS. 9 and 10 numeral 1 indicates a single crystal substrate such as MgO, numeral 2 indicates an oxide superconducting thin-film (device) such as $YBa_2Cu_3O_{7-x}$ ($0 \leq X \leq 0.5$) or $NdBa_2Cu_3O_{7-x}$ ($0 \leq X \leq 0.5$), numeral 3 indicates an irradiation region of a converging ion beam, numerals 4, 5, and 6 indicate a grain boundary of the oxide superconducting thin-film 2, numerals 7 and 7' indicate electrodes for extraction. In the irradiation region of a converging ion beam 3 the ion beam etches the substrate 1 to form a V-shaped groove. When the oxide superconducting thin-film is formed on the MgO substrate so as to be oriented in the direction of the c-axis, the film oriented in the direction of the c-axis will grow in such a manner that the c-axis is perpendicular to the substrate on the plane surface of the MgO substrate, and the c-axis is also perpendicular to an inclined surface of a V-shaped groove portion. As a result, a grain boundary in which orientations of the adjacent crystal grains are different from each other is formed, and this grain boundary portion forms weak links at the regions 4, and 6 shown in FIG. 10, where the crystal grain grown on the substrate comes into contact with the crystal grain grown on the inclined surface of the groove, and also forms a weak link at the region 5 shown in FIG. 10, where the crystal grains grown on the inclined surfaces of the groove come into contact with each other, so that a junction is formed.

FIGS. 11A, 11B, and 11C are sectional views showing the fabricating processes of a conventional method for fabricating an oxide superconducting device. Referring to FIG. 11A, a gold thin-film 8 having a thickness of about 100 nm is formed on the substrate 1 and a Ga ion beam is radiated at a junction fabricating portion by means of a converging ion beam apparatus. The gold thin-film 8 is a film to inhibit electrification due to the ion beam. Then, as shown in FIG. 11B, the gold thin-film 8 is completely removed. Since the beam intensity distribution of an ion beam has a Gaussian distribution, as shown in FIG. 11B, a V-shaped groove is formed in the ion beam irradiation region 3 of the substrate 1. Next, as shown in FIG. 11C the oxide superconducting thin-film 2 is formed. Then, a pattern is formed so as to cross over the ion beam irradiation region 3 and the device shown in FIG. 9 is fabricated.

Since the method for fabricating junctions using a converging ion beam has a high degree of freedom for arrangement of junctions and it provides an advantage in its feasibility in micromachining as described above, the feasibility in fabricating an integrated circuit and the like is high. Under the present circumstances, however, because of a wide range of variations in device characteristics such as a critical current of each device and because of poor reproducibility, there is a problem that it is difficult to prototype with high reproducibility a circuit combined with a plurality of devices.

It is necessary to form with high reproducibility an optimized groove configuration for constructing a junction in order to form a device having high reproducibility and uniformity. In a conventional method for fabricating junctions using a converging ion beam, however, it is difficult to optimize the groove configuration, because the beam intensity distribution determines the groove configuration and only a limited configuration is obtained under performance specifications of the converging ion beam apparatus.

Further, since the beam intensity distribution differs according to the apparatus and to the ion source, and the ion source varies over time, a problem arises in the reproducibility of the groove configuration, such as variation in the groove configuration due to a change of the apparatus or replacement of the ion source.

FIG. 12 shows measured data of the sectional configuration of the groove portion of an MgO substrate in a conventional method for fabricating junctions using a converging ion beam. A gold thin-film with a thickness of 100 nm is formed on the MgO substrate and the junction forming portion is irradiated with a Ga ion beam using a converging ion beam apparatus. Acceleration voltage is 30 KeV, beam current is 6 pA, and amount of ion irradiation is $5.12 \times 10^{17}/cm^2$. FIG. 12 shows data measuring the sectional configuration of the MgO substrate by means of AFM after removing the gold thin-film. FIG. 13 illustrates variations of the inclination angle of the inclined portion according to the position of the beam within the groove in FIG. 12.

When the width of the groove is small, growth of a crystal grain whose orientation is the same on a groove as on the substrate is predominant, so that a junction is not formed. An inclined surface having an almost fixed inclination with a certain length is necessary in order that film oriented in the direction of the c-axis may grow ably along the inclined surface of the groove. For example, the inclined surface needs a length not less than several tens of nm in a typical film forming condition of the YBCO film on the MgO substrate.

Referring to FIG. 12, the conventional inclined portion of a groove apparently seems to have an inclined surface with a fixed inclination angle, but actually there is no fixed inclination angle portion as appreciated in FIG. 13. Therefore, although there is no fixed inclination angle of the inclined surface, a crystal grain grows centering in a region with small variations in angle within a range of several tens of nm. For example, referring to FIG. 13, in a and b regions positioned near the center of a groove a crystal grain having an inclination angle of about 18–20° (degree) may grow dominantly. In c and d regions a crystal grain having an inclination angle of about 10° may grow dominantly.

Ideally, a crystal grain grows dominantly in a region having a small variation in inclination angle with large width, so that a crystal grain with a fixed crystal orientation grows over the entire inclined surface, junctions are formed at the positions 4, 5, and 6, illustrated in FIG. 10. As shown in FIG. 13, however, when the dominant angle is not clear, the following cases may occur. One case is that growth of a crystal grain having an inclination angle of about 20° in the central portions of the groove indicated by a and b becomes dominant, and it spreads over the entire groove. Another case is that growth of a crystal grain may occur in a and b regions, and c and d regions with inclination angles that are different from each other. The other case is that growth of a crystal grain of about 15° that donates a degree between the region a and b, and a degree between the region c and d may occur dominantly over the entire groove. Further, there may be a case that these cases described above are mixed according to positions of junctions(vertical direction in FIG. 9).

Although the characteristics of a device depend greatly on the inclination angle of a grain boundary, it is impossible to fabricate a groove configuration with a fixed inclination angle using a conventional fabricating method. This, then, has contributed to the variations in the characteristics of devices. Further, because of the poor reproducibility in forming a groove configuration, the reproducibility in the characteristics of a device is also poor.

In FIG. 12 a V-shaped groove having a width of about 120 nm and a depth of about 15 nm is obtained. When the period of fabrication and the amount of irradiation ion increase, the depth of the groove can become deeper. But since the diameter of the beam determines the width of the groove, the width of the groove hardly changes even if the amount of ion irradiation increases. Therefore, in the conventional method it is impossible to optimize the depth and the width of a groove. This causes the following problems.

When the thickness of a superconducting thin-film becomes large, a crystal grain that grows on an outer side of a groove on a substrate elongates toward the inside from both sides of the groove to cause the groove to be filled, and eventually two crystal grains make contact at a surface portion of the thin-film. In this state, the grain boundary that has an inclination angle to cause a weak link is not formed on the surface portion of the thin-film so that a leak current is caused to flow. In a YBCO thin-film forming condition, when the thickness of the thin-film becomes not less than 300 nm, the number of junctions in which a leak current is dominant increases, the characteristics of the device vary, and reproducibility deteriorates.

In order to avoid this leak current and to realize stable characteristics in spite of a large thickness of a thin-film, it is necessary to extend the width of a groove according to the thickness of the thin-film. Since the junction characteristics depend greatly on the variations in angle at a grain boundary portion, it is necessary to adjust the depth so as to make it deeper according to the width in order to optimize the inclination angle. Taking into consideration the application of an oxide superconducting device to an electronic device, ideally the thickness of a superconducting thin-film must be thicker than a wave length penetrating into a magnetic field. For example, in the case of YBCO the thickness of a thin-film is preferably not less than 300 nm. In a conventional fabricating method, however, it is impossible to adjust the width and the depth of a groove according to the thickness of a superconducting thin-film and to obtain a desirable inclination angle, so that it is difficult to fabricate a device with small variations and with high reproducibility.

Since in the example shown in FIG. 10 three junctions are formed within the groove, the junction represents characteristics such that three junctions are connected in series. The serial connection of the junctions causes problems in some uses of a device. In order to avoid such problems, there is provided a device with only one junction formed in the bottom portion of a groove in such a manner that the inclination angle of the inclined portion of a V-shaped groove becomes gradually smaller toward the periphery of the groove.

FIGS. 14A, 14B, 14C and 14D are diagrams illustrating a fabricating operation and processes showing the method for fabricating the superconducting device described in Japanese Patent Laid-Open No. 7-94790. An MgO substrate 1 is prepared as shown in FIG. 14A, a V-shaped groove 3 is formed using a converging ion beam as shown in FIG. 14B, the V-shaped edge is shaved to become smooth by means of an etching over the entire surface of the substrate using an Ar ion milling apparatus, and a curved portion 9 is formed as shown in FIG. 14C. Finally, as shown in FIG. 14D, a YBCO thin-film 2 oriented in the direction of the c-axis is formed. A device can be fabricated in which only a grain boundary positioned at the center portion of a V-shaped groove determines the characteristics by achieving a radius of curvature in the curved portion so as to cause no grain boundary.

This fabricating method has the following problems. It is difficult to optimize the groove configuration, because the configuration is eventually determined by the beam configuration of the converging ion beam and the etching characteristics of the Ar ion milling apparatus. For example, when the curved portion 9 is processed to a curvature so as to cause no grain boundary, the central portion of the groove is also etched. So it is difficult to maintain an optimal V-shaped groove for a junction. Additionally, it is difficult to form a groove configuration so as to fix an angle of a grain boundary portion with high reproducibility. The reason is as follows; although the characteristics of a device are eventually determined by the angle of a grain boundary at the central portion of a V-shaped groove, the etching method using a converging ion beam apparatus is the conventional method shown in FIGS. 9, 10, and 11.

Further, FIGS. 15A, 15B, and 15C are diagrams illustrating a fabricating operation and process showing the case in which a substrate is processed by radiating a converging ion beam from a slanting direction in such a manner that one side of the inclination angle of the V-shaped groove is obtuse and the opposite side of the inclined angle is acute in accordance with Japanese Patent Laid-Open No. 8-153832. A detailed description will be omitted because it is the same as the case described in FIGS. 11A, 11B, and 11C. An ion beam is radiated from a slanting direction of the substrate as distinct from FIGS. 11A, 11B, and 11C. Junctions can be stably formed by means of an acute angle of a beam irradiation, even if conditions for forming a thin-film or a substrate are changed. In this case it is also difficult to obtain an optimized groove configuration with high reproducibility, since the fabricating method is the same as the conventional method described in FIGS. 9, 10, and 11 except that an ion beam is radiated from a slanting direction.

SUMMARY OF THE INVENTION

This invention has been made in order to solve these problems in the conventional methods. It is an object of the present invention to provide an oxide superconducting device (a Josephson Junction device) in which a slight variation in characteristics such as critical current density exists and which provides high reproducibility by forming an optimal groove configuration for the junction.

To attain the above object, this invention provides a method for fabricating an oxide superconducting device including the steps: forming at least one groove on a substrate by a converging ion beam and forming a barrier with reduced superconductivity on the oxide superconducting thin-film on the groove to form a Josephson Junction, and wherein an irradiation ion amount of the converging ion beam is varied according to the position of the beam within the groove to thereby process the substrate to a desired configuration in such a manner that the configuration of the groove portion provided on the substrate is optimized for the junction formation.

In the method for fabricating an oxide superconducting device according to this invention, when the substrate is processed by means of a converging ion beam, the amount of irradiation is varied according to the position of the beam within the groove so that an optimized configuration of the groove for the junction is formed, whereby an oxide superconducting device (a Josephson Junction device) can be realized, in which characteristics of the device such as critical current density slightly vary and which provides high reproducibility.

DETAILED DESCRIPTION OF THE INVENTION

Figure 1A:
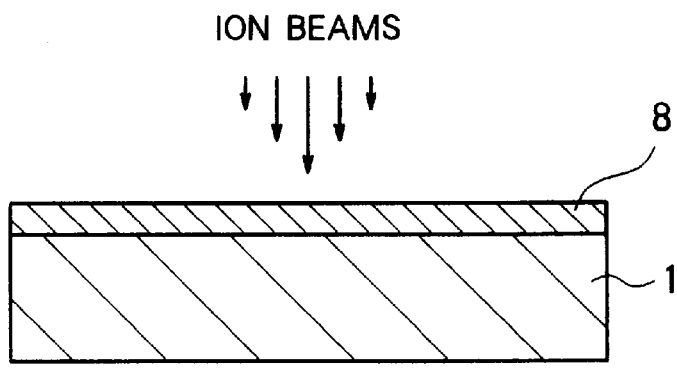
FIGS. 1A, 1B, and 1C are sectional views showing fabricating processes of a method for fabricating an oxide superconducting device according to an embodiment of the present invention.
Figure 1B:
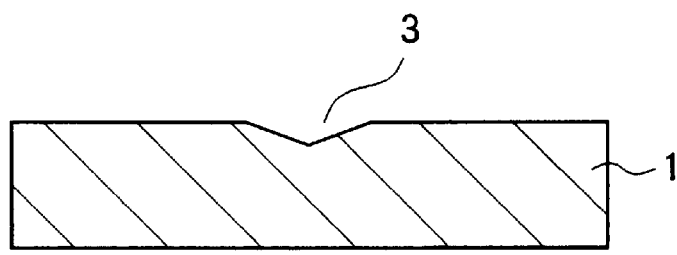
Figure 1C:
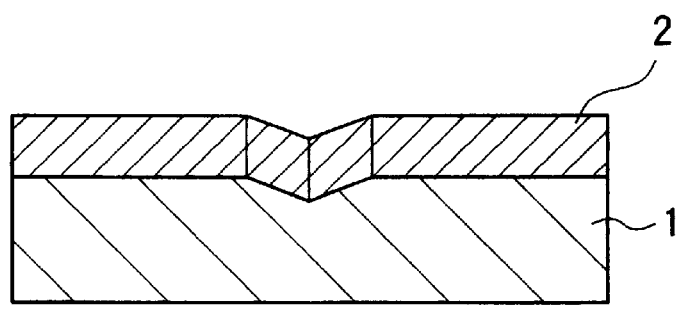

Referring to FIGS. 1A, 1B, and 1C, there will be given a detailed description of an embodiment of an oxide superconducting device according to this invention.

FIGS. 1A, 1B, and 1C are sectional views showing the fabricating processes of the method for fabricating an oxide superconducting device according to this invention. In FIGS. 1A, 1B, and 1C the same numerals indicates the components which are the same or corresponding to those of the conventional example shown in FIGS. 9, 10, 11A, 11B, and 11C. Numeral 1 indicates a single crystal substrate such as MgO, numeral 2 indicates an oxide superconducting thin-film such as $YBa_2Cu_3O_{7-x}$ ($0 \leq X \leq 0.5$) or $NdBa_2Cu_3O_{7-x}$ ($0 \leq X \leq 0.5$), numeral 3 indicates an irradiation region of a converging ion beam, and numeral 8 indicates a gold thin-film.

Referring to FIG. 1A, a gold thin-film 8 having a thickness of about 100 nm is formed on the substrate 1 and a Ga ion beam is radiated to a junction fabricating portion by means of a converging ion beam apparatus. The gold thin-film 8 is the film to prevent electrification due to the ion beam. The thickness of the thin-film is limited to 100 nm. A V-shaped groove is formed on the substrate by means of the ion beam. In this process the irradiation amount of converging ion beam is varied according to the position of the beam within the groove in such a manner that the inclination angle of the inclined portion of the V-shaped groove portion is fixed. Then, as shown in FIG. 1B, the gold thin-film 8 is completely removed. Next, as shown in FIG. 1C, the oxide superconducting thin-film 2 is formed. Then, a pattern is formed so as to cross over the ion beam irradiation region 3 and a device is fabricated. Since the configuration in plan view of the device is the same as that of the conventional example shown in FIG. 9, a description thereof will be omitted.

Figure 2:
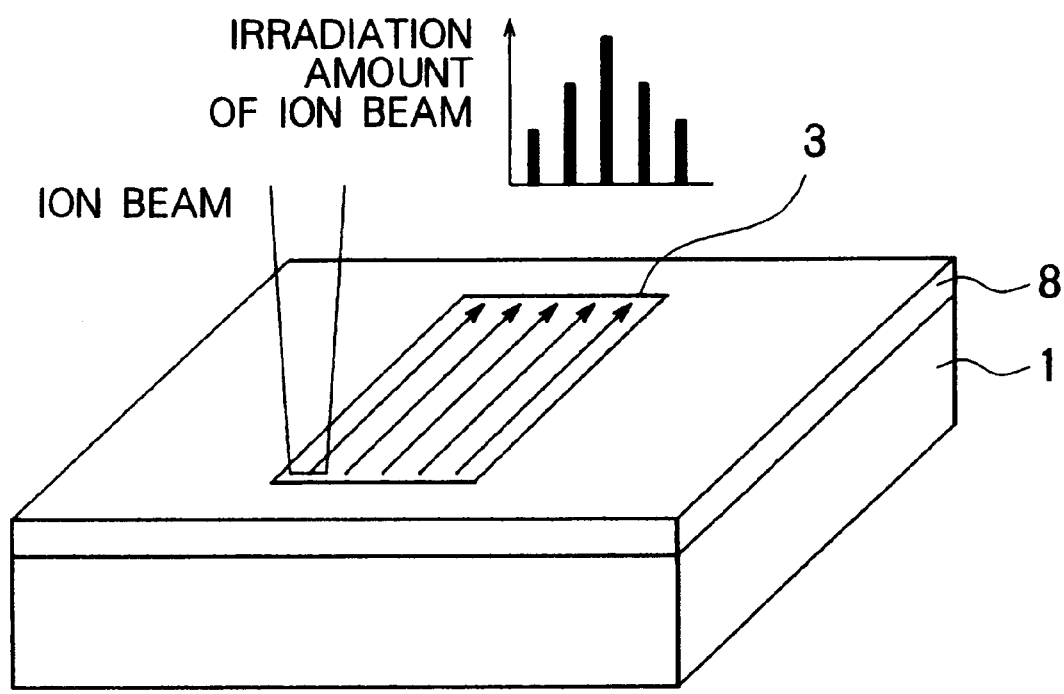
FIG. 2 is a schematic diagram showing a method for shaping a groove according to an embodiment of the present invention.

Referring to FIG. 1A, the distribution of the irradiation amount of the ion beam, when the substrate is processed by varying the irradiation amount of the ion beam in three steps in such a manner that the irradiation amount is maximal at the center region, is illustrated schematically by means of lengths of arrows. Referring to FIG. 2, showing a schematic diagram illustrated with a skewing upper view, the embodiment of the method for irradiating the ion beam of FIG. 1A will be described. Referring to FIG. 2, numeral 1 indicates an MgO substrate, numeral 8 indicates a gold thin-film, and numeral 3 indicates an irradiation region of an ion beam. Arrows within the irradiation region of the ion beam 3 indicate a scanning direction. The irradiation of the ion beam is carried out as follows. First, the ion beam starts to scan from the left-hand arrow line in the direction of the arrow, from the front to the back of the irradiation region 3. with the ion beam being radiated. Next, the ion beam scanning position is shifted by a certain beam pitch (In FIG. 2 the interval between arrowhead lines) to the next to the left one and the irradiation of the beam is performed. The ion beam is radiated while the scanning line is displaced toward right one after another in this way. The period of irradiation determines the irradiation amount of the ion beam. Only one scanning may make it possible to obtain a desirable irradiation amount of the ion beam, or a plurality of scannings may make it possible to obtain a desirable irradiation amount of the ion beam. As will be understood from the foregoing, the irradiation amount of the converging ion beam is varied according to the position of the beam within the groove by means of a plurality of ion beams, so that it is possible to obtain a groove having a fixed inclination angle of the inclined portion of the V-shaped groove portion on the substrate.

Figure 3:
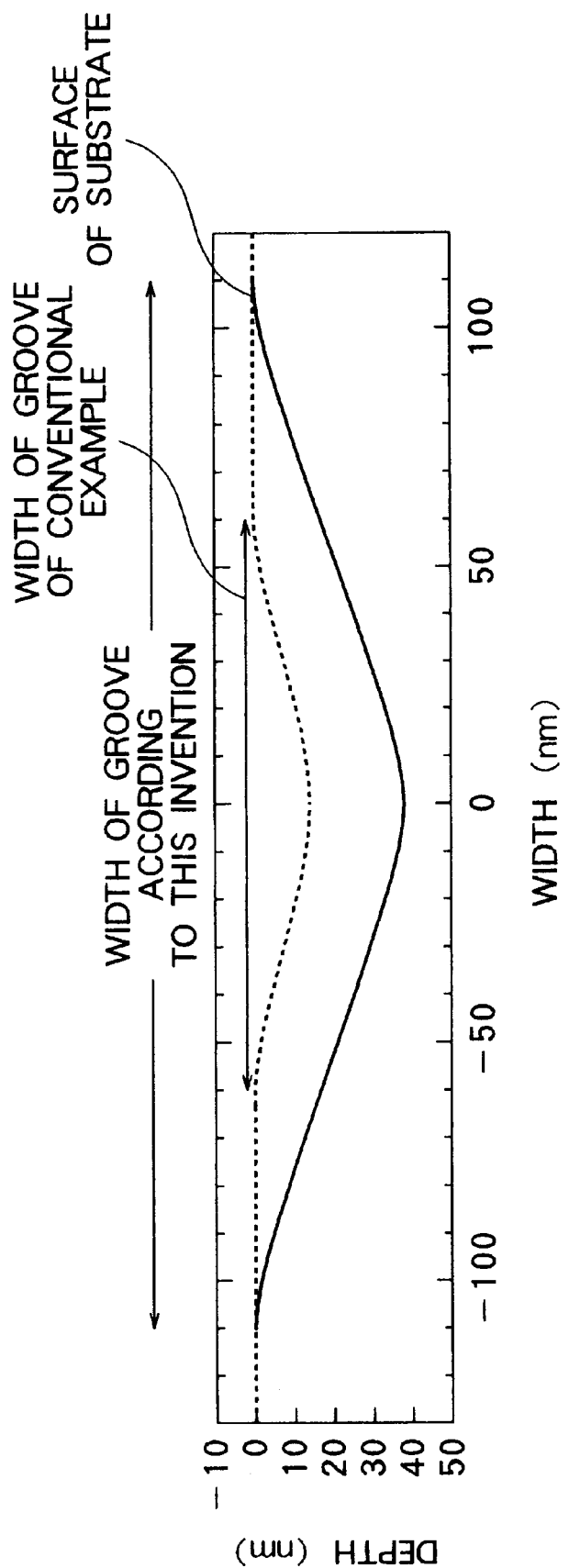
FIG. 3 shows measured data of the sectional configuration of a shaped groove portion according to an embodiment of the present invention.
Figure 12:
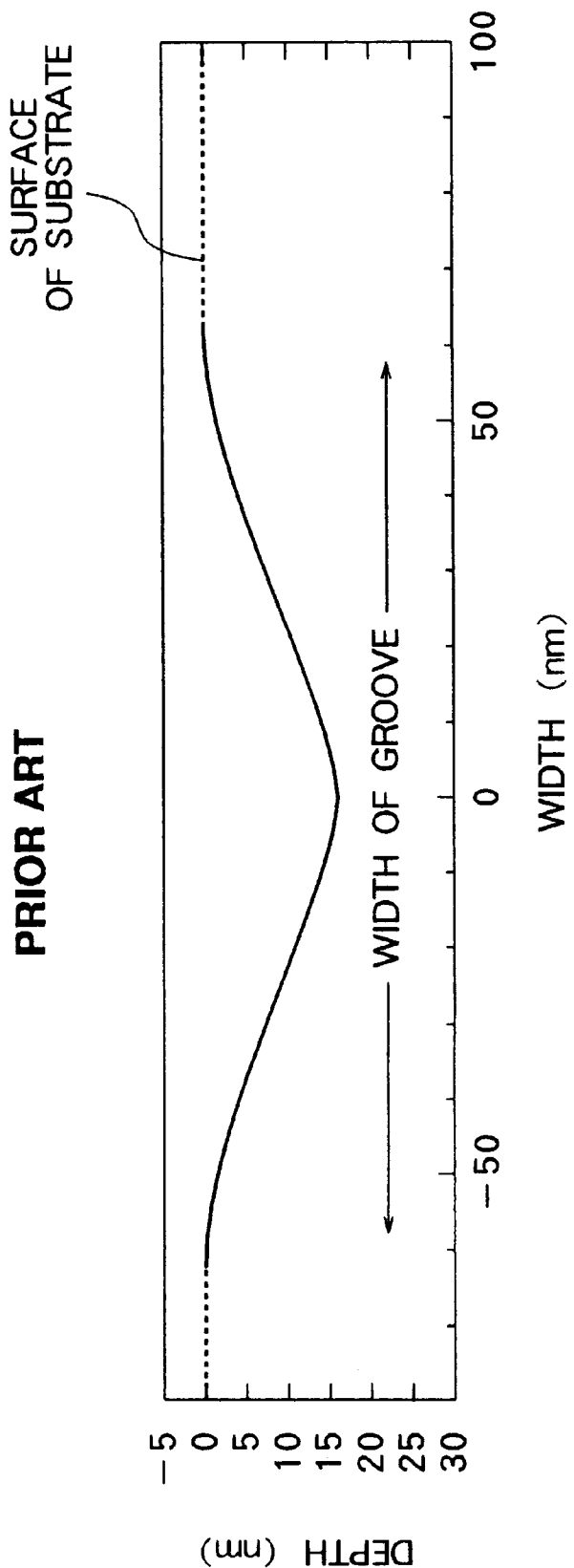
FIG. 12 shows measured data of the sectional configuration of a shaped groove portion in a conventional example.

FIG. 2 is a schematic diagram showing a method for shaping a groove according to an embodiment of the present invention. The solid line in FIG. 3 represents measured data of the sectional configuration of the shaped groove portion according to the method for processing the groove illustrated in FIG. 2. In order to compare with the conventional example the dotted line shows the configuration of the line described in FIG. 12. The gold thin-film having a thickness of 100 nm is formed on the MgO substrate and the Ga ion beam is radiated to the junction fabricating portion by means of a converging ion beam apparatus. FIG. 3 shows the measured data of the sectional configuration of the MgO substrate by means of AFM after removing the gold thin-film.

The substrate has been processed by varying the irradiation amount of the ion beam in three steps with the beam pitch of 30 nm in such a manner that the irradiation amount of the ion beam becomes maximal in the center region of the groove under the same conditions as shown in FIG. 2. Acceleration voltage is 30 KeV and beam current is 6 pA. The amount of ion irradiation is $4.08 \times 10^{17}/cm^2$ at the center position, $2.72 \times 10^{17}/cm^2$ at the position ±30 nm away from the center, and $1.36 \times 10^{17}/cm^2$ at the position ±60 nm away from the center.

Figure 4:
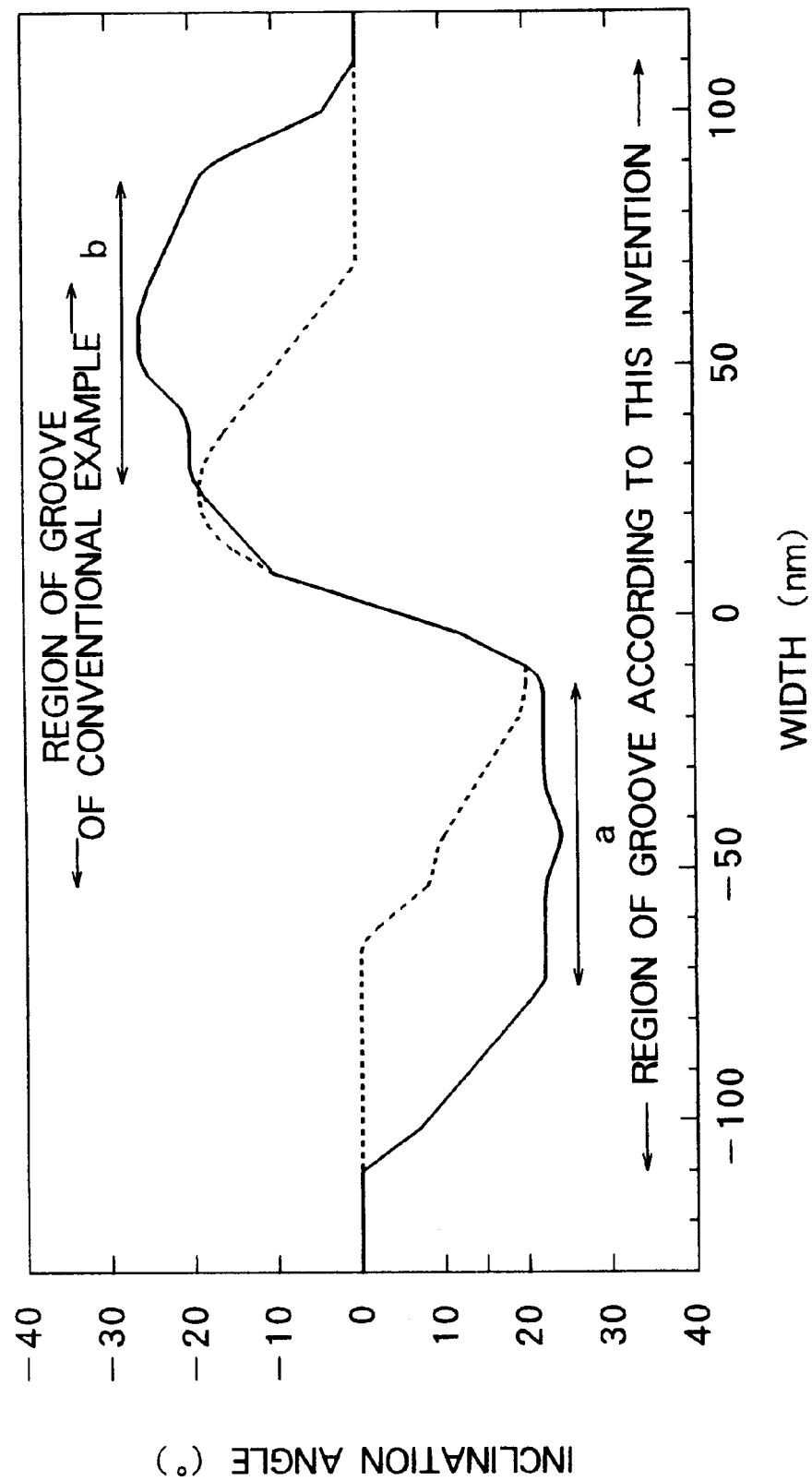
FIG. 4 illustrates FIG. 3 with respect to inclination angle.
Figure 13:
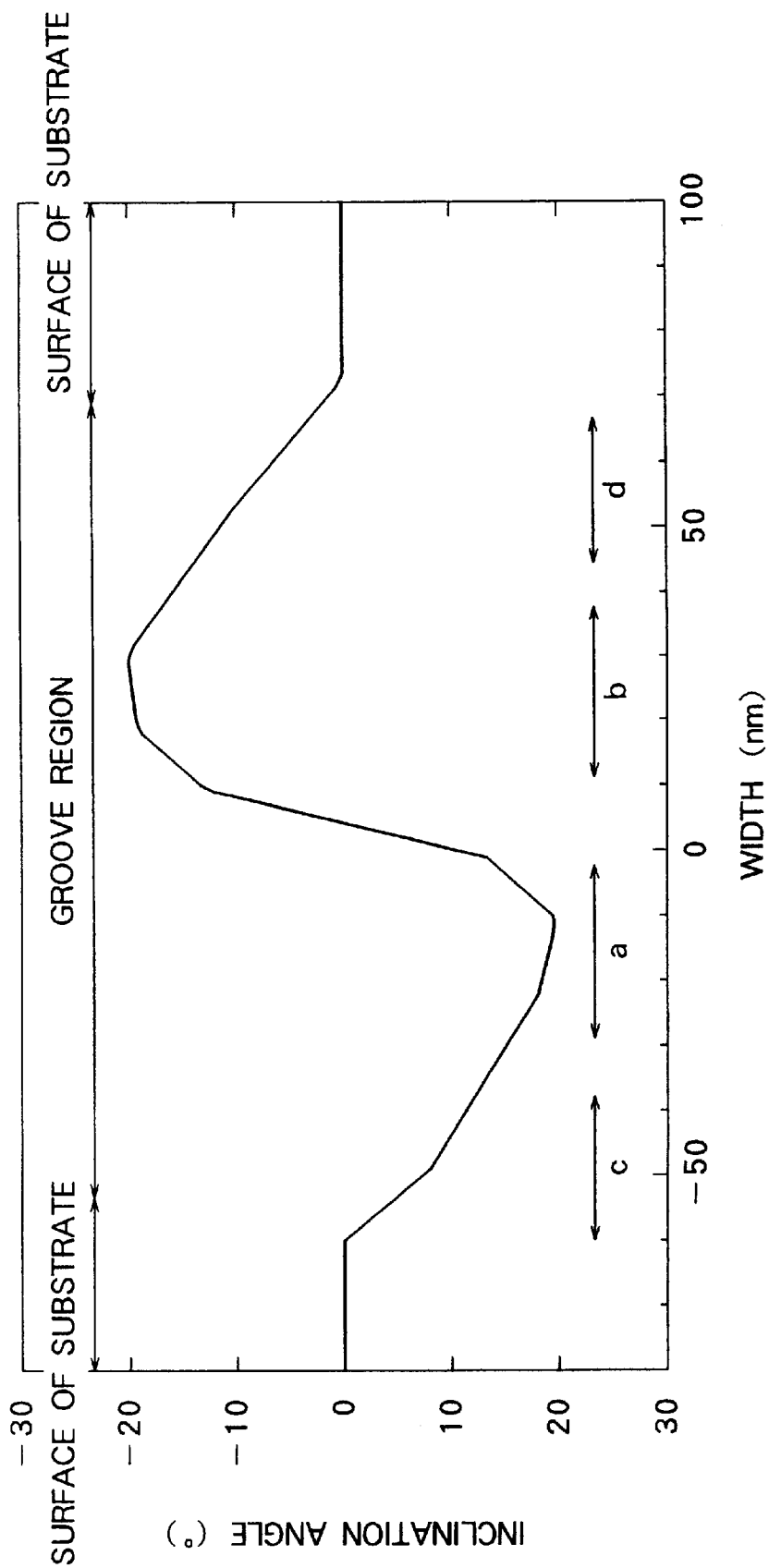
FIG. 13 is a diagram illustrating FIG. 12 with respect to an inclination angle.
Figure 14A:
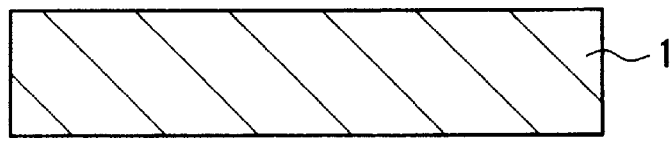
FIGS. 14A, 14B, 14C, and 14D are sectional views showing fabricating processes of a conventional method for fabricating an oxide superconducting device.
Figure 14B:
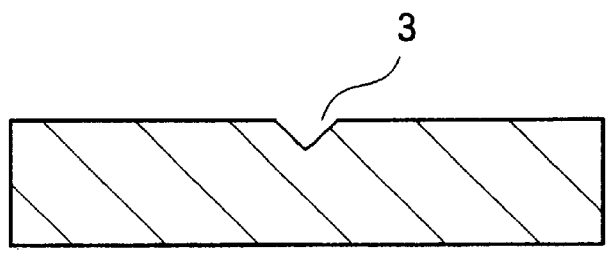
Figure 14C:
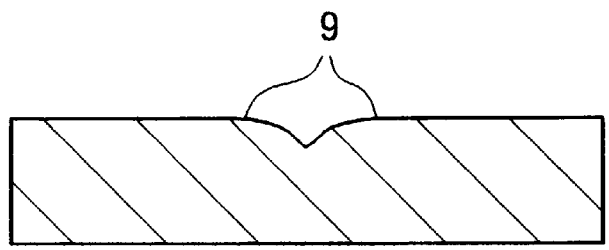
Figure 14D:
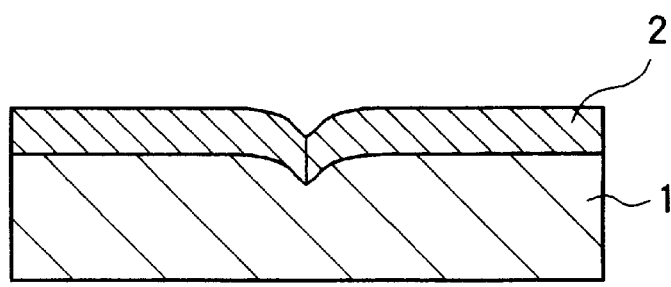

FIG. 4 shows the variations of the inclination angle of the inclined portion according to the position of the groove shown in FIG. 3. As in FIG. 3, the solid line indicates the data of this invention and the dotted line indicates the data of the conventional example shown in FIG. 13. It is clear that the regions with the fixed inclination angle of the inclined portion of the groove (regions a and b) are wider than that of the conventional case.

Figure 5:
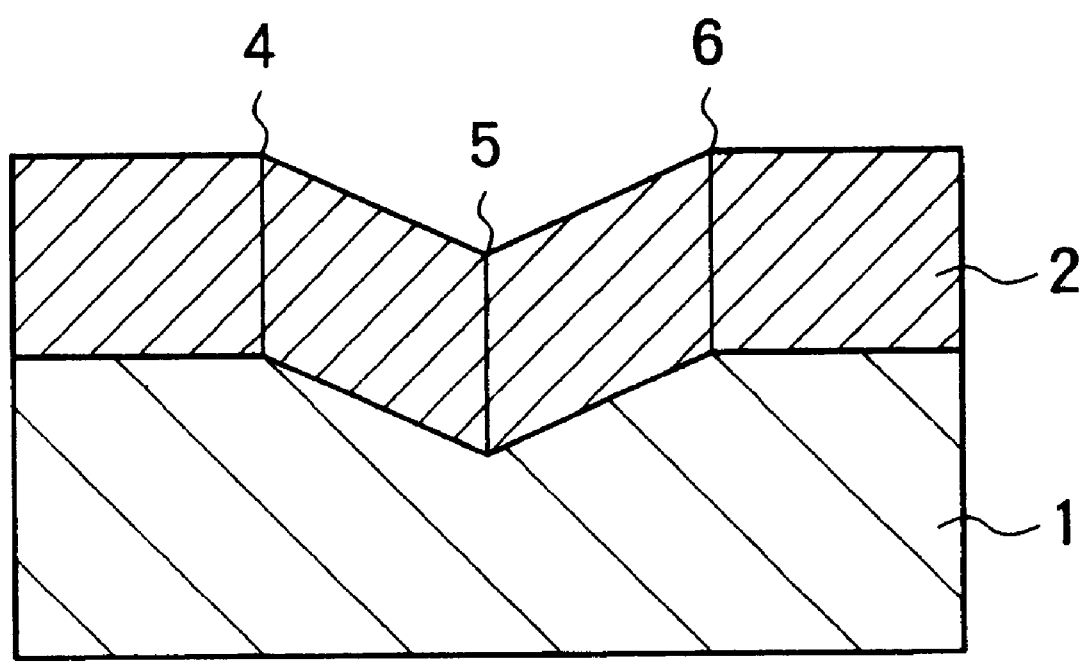
FIG. 5 is a sectional view of a junction portion of an oxide superconducting device according to an embodiment of the present invention.

FIG. 5 illustrates a schematic sectional view of the junction portion shown in FIG. 1C. In FIG. 5 numeral 1 indicates a single crystal substrate such as MgO, numeral 2 indicates an oxide superconducting thin-film such as $YBa_2Cu_3O_{7-x}$ ($0 \leq X \leq 0.5$) or $NdBa_2Cu_3O_{7-x}$ ($0 \leq X \leq 0.5$), numeral 3 indicates an irradiation region of a converging ion beam, and numerals 4, 5, and 6, indicate a grain boundary of the oxide superconducting thin-film 2. A V-shaped groove configuration is formed in a converging ion beam irradiation region 3 by means of a group of ion beams.

The film, which is formed on the MgO single crystal substrate oriented in the direction of the c-axis, will grow in such a manner that the c-axis is perpendicular to the substrate on the plane surface of the MgO substrate and the c-axis is also perpendicular to an inclined surface of the groove in the V-shaped groove portion. As a result, a grain boundary in which orientations of the adjacent crystal grains are different from each other is formed, and this grain boundary portion forms weak links at the regions 4, and 6 shown in FIG. 5, where the crystal grain grown on the substrate comes into contact with the crystal grain grown on the inclined surface of the groove and at the region 5 shown in FIG. 5 where crystal grains grown on the inclined surfaces of the groove comes into contact with each other, so that a junction is formed.

In the method for fabricating the device according to this invention the region with a fixed inclination angle of the inclined portion of the groove is wider than that of the conventional case as shown in FIG. 4. For example, the region a on the inclined plane shown in the left-hand side of FIG. 4, the region with the fixed angle of about 22° is obtained. In the region b shown in the right-hand side of FIG. 4, the region with the stable angle of about 22–26° is also obtained, even though it is not in the same fixed condition as region a.

As compared with the conventional method since there is provided a region where the inclination angle can be regarded as a fixed state in a range of several tens of nm, a crystal grain with fixed inclination angle grows stably in this region with little variations of the angle, the growth of the crystal grain having this angle becomes predominant over the entire inclined surface of the groove, the crystal grain having a fixed crystal orientation grows over the entire inclined surface of the groove, and the junctions are formed at the positions indicated at 4, 5, and 6 as shown in FIG. 5.

Although the configuration of the distribution of the beam intensity determined the groove configuration conventionally, according to this invention it is possible to set an optimal angle of the groove freely by varying the irradiation amount of the ion beam and the amount of the beam pitch with respect to the position of the beam within the groove. It is also possible to adjust such that the inclined surface of the groove has a fixed angle. Therefore, a junction can be formed in which the characteristics are uniform and have little variations, and their reproducibility is satisfactory.

Additionally, when the higher amount of the ion beams as shown FIGS. 1A, 1B, and 1C is radiated, the width of the groove can become larger. In this invention it is possible to adjust freely the inclination angle of the groove by means of the irradiation amount of the ions and the beam pitch, and to adjust freely the width of the groove by means of the number of beams and the beam pitch. Since the characteristics of the junction portion depend greatly on the variation of the angle at the grain boundary portion, it is necessary to adjust the depth of the groove to become larger when the width of the groove becomes larger so as to obtain an optimal inclination angle. According to this invention the groove with a desired inclination angle and a desired depth can be obtained easily, when the irradiation amount of the ions is adjusted at each position of the beam within the groove. Thus, in fabricating a junction on a superconducting thin-film with a large thickness which was difficult in the prior art, it is possible to fabricate a device with little variation in the characteristics and with high reproducibility, by obtaining a desirable inclination angle by means of adjustment of the width and the depth according to the thickness of the superconducting thin-film.

According to this invention the following methods for radiating the beams are adopted. Beams with varying the beam intensity with regard to each beam may be radiated displacing from one side toward another in sequence. A plurality of beams may be radiated over the entire irradiation region and then the numbers of the beams are reduced in sequence in such a manner that both outside beams are omitted at the next radiation so that the fabricating width may become smaller. Conversely, the fabricating width may become larger by increasing the number of beams in sequence beginning from one beam at the center. In short, any method may be useful as long as the irradiation amount of the ions can be varied eventually. With regard to the beam pitch, it is required that the beam pitch should be smaller than the fabricating width of one beam. For example referring to FIG. 3, when the fabricating width of one beam is about 120 nm, the beam pitch is 30 nm which is small enough, so that the smoothly inclined configuration is obtained. In FIG. 3, as a beam pitch of 30 nm is shown as one example, the beam pitch may be smaller, When a beam with a large fabricating width is used, a pitch of not less than 30 nm may be used.

Further, according to this invention when the varying rate of the beam intensity is changed, an arbitrary configuration of the groove may be obtained other than the V-shaped configuration. In addition, the configuration of the groove can be obtained by means of the simulation technique by varying the conditions of the beam intensity, the number of beams, the beam pitch and the like, so that the intended arbitrary configuration of the groove can be obtained with high reproducibility.

Figure 6:
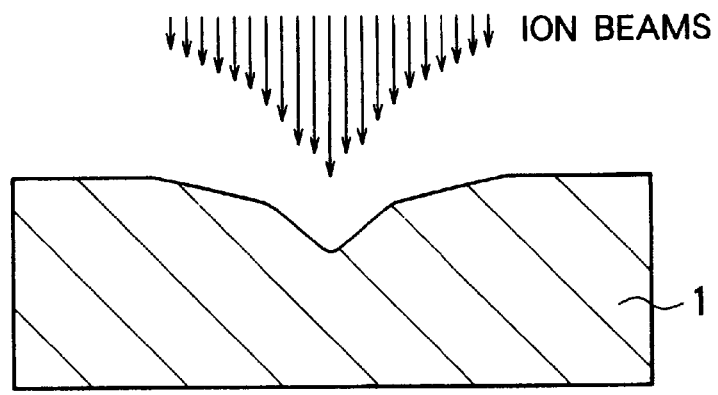
FIG. 6 is a sectional view of a junction portion of an oxide superconducting device according to another embodiment of the present invention.

FIG. 6 is a schematic sectional view showing the ion beams and the configuration in processing when the conventional oxide superconducting device shown in FIGS. 14A, 14B, 14C, and 14D is fabricated using the method of an embodiment according to this invention. The distribution of the irradiation amount of the ion is illustrated schematically by using the length and the position of arrows. As described above in this junction the groove is required to maintain an optimal configuration and the curved portion is required simultaneously to achieve a radius of curvature in the curved portion so as to cause no grain boundary. According to this invention, an optimal V-shaped configuration for junctions is formed in the central portion of the groove by means of the beam distribution such as that shown in FIG. 1 and a curved portion with a desired radius of curvature is formed by reducing gradually the beam intensity in accordance with the distance from the center portion of the groove, so that an junction with little variation in characteristics and with high reproducibility is formed because an optimal configuration is easily obtained with high reproducibility. Further, as compared with the conventional processing method the ion milling process is not required and it is possible to process using only the converging ion beam apparatus, so that the processes for fabricating the device can decrease.

Figure 7:
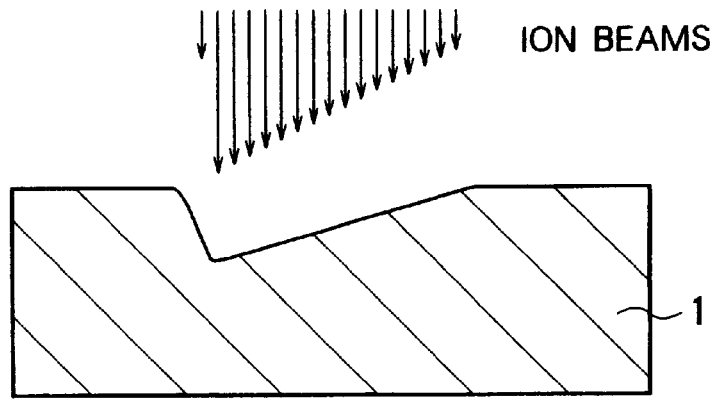
FIG. 7 is a sectional view of a junction portion of an oxide superconducting device according to still another embodiment of the present invention.
Figure 15A:
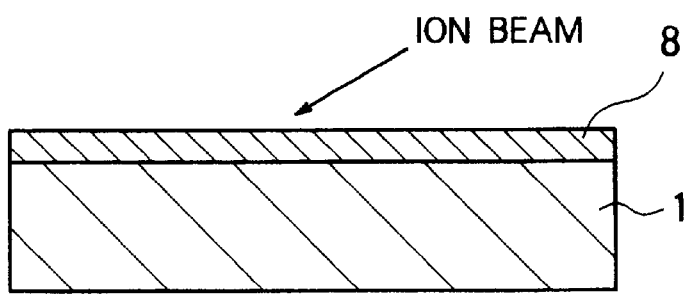
FIGS. 15A, 15B, and 15C are sectional views showing fabricating processes of another conventional method for fabricating an oxide superconducting device.
Figure 15B:
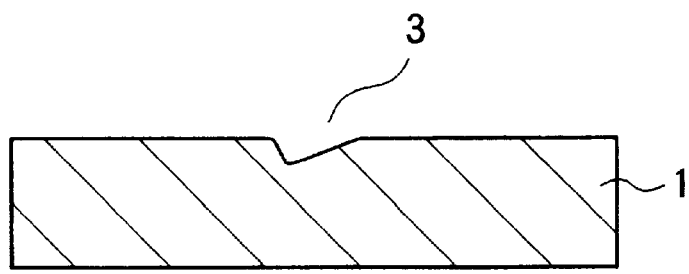
Figure 15C:
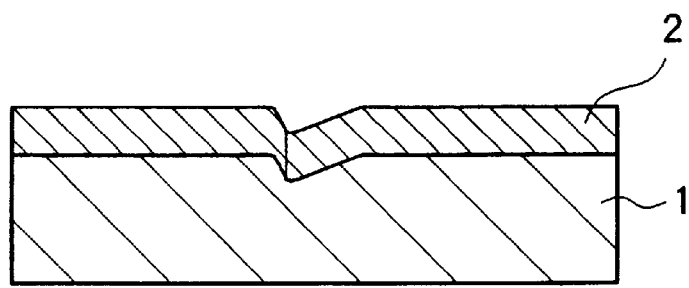

Further, FIG. 7 is a schematic sectional view showing the ion beams and the configuration in processing when the conventional oxide superconducting device shown in FIGS. 15A, 15B, and 15C is fabricated using the method of an embodiment according to this invention. The distribution of the irradiation amount of the ion is illustrated schematically by using the length and the position of arrows. As described above in this junction the inclination angle of one side of the V-shaped groove is acute and the inclination angle of the opposite side is obtuse. According to this invention a groove configuration in which the inclination angle of one side of the V-shaped groove is acute and the inclination angle of the opposite side is obtuse can be easily formed, and is also fabricated with high reproducibility by adjusting the groove so as to achieve an optimized configuration for the junction by using the beam distribution such as that shown in FIG. 7, so that the junction with a little variation in characteristics is formed with high reproducibility.

Figure 8A:
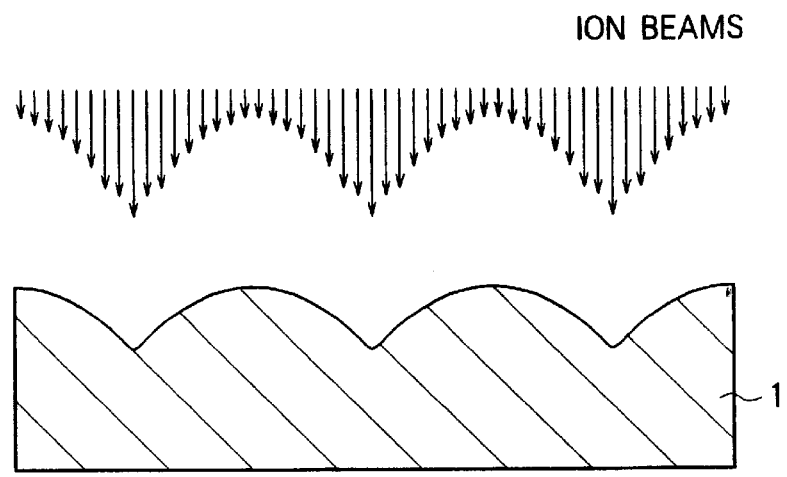
FIGS. 8A and 8B are sectional view of a junction portion of an oxide superconducting device according to a further embodiment of the present invention.
Figure 8B:
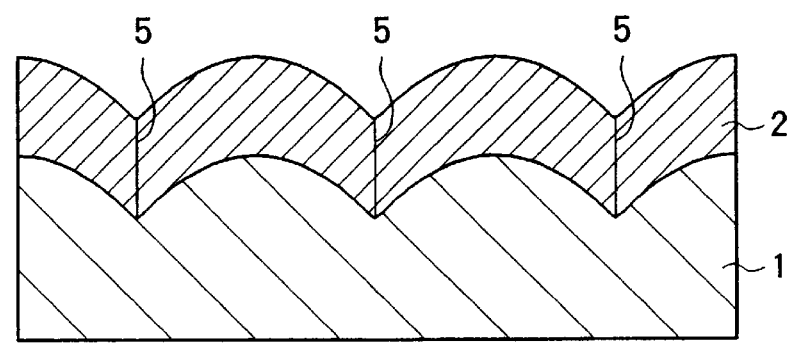
Figure 9:
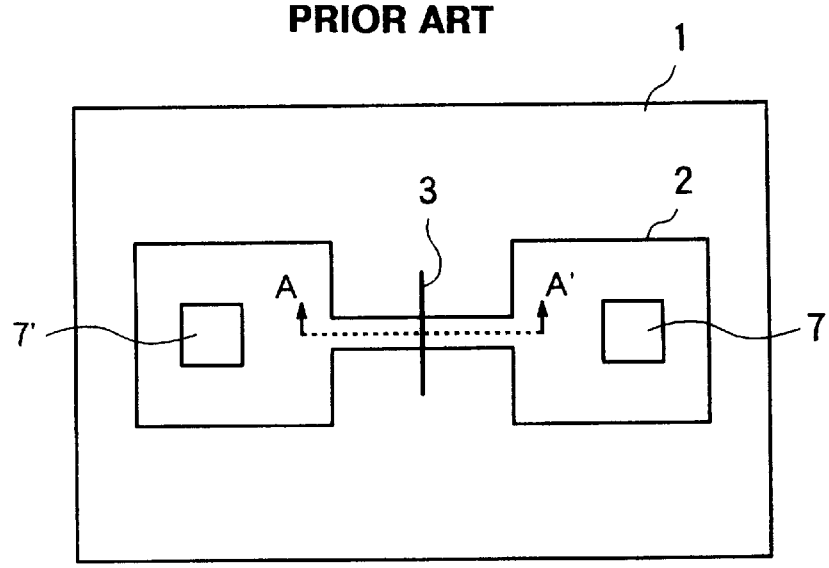
FIG. 9 is a plan view of an oxide superconducting device according to a conventional example and an embodiment of the present invention.
Figure 10:
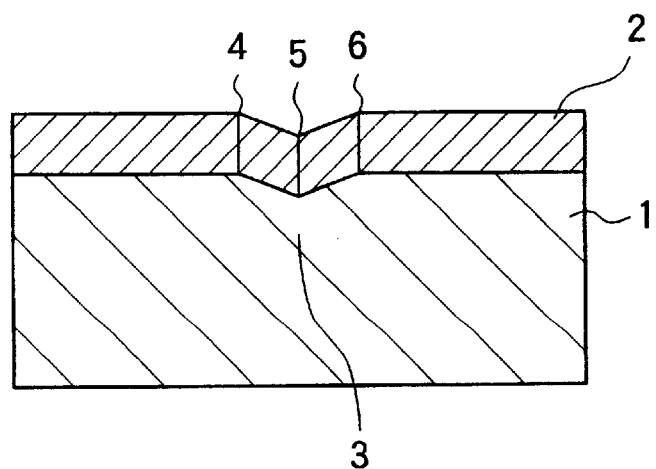
FIG. 10 is a cross-sectional view of the conventional oxide superconducting device taking along the line A–A' of FIG. 9.
Figure 11A:
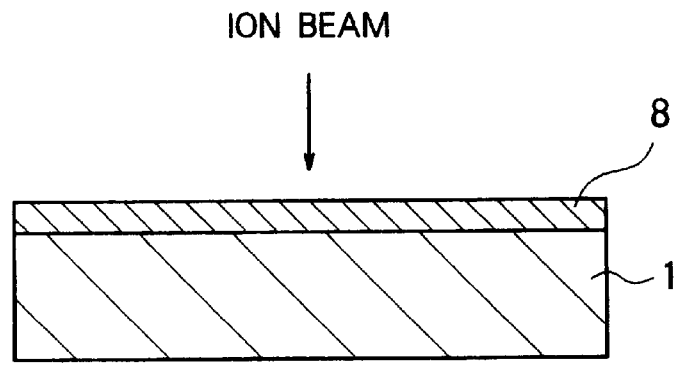
FIGS. 11A, 11B, and 11C are sectional views showing each fabricating process of a conventional method for fabricating an oxide superconducting device.
Figure 11B:
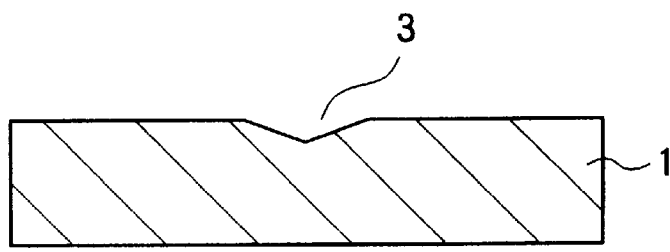
Figure 11C:
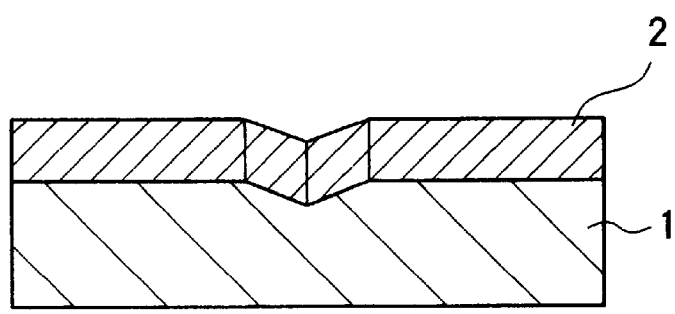

FIG. 8A is a schematic sectional view showing the beams and the processing configuration of the substrate when a group of grooves are formed by varying the irradiation ion amount of the converging ion beam according to the position of the beam within the groove in such a manner that the junctions as shown in FIG. 6 are connected in series. The distribution of the irradiation amount of the ion is illustrated schematically by using the length and the position of arrows. As shown in FIG. 8B, when the oxide superconducting thin-film 2 is formed on the substrate, a plurality of junctions of grain boundaries 5 are formed in the center portion of the groove. Since junctions connected in series in a micro region is realized, it is possible to realize a device having a junction with high resident conductive resistance. Although in FIG. 8, an example having the junctions shown in FIG. 6 in series is illustrated, examples having the junctions shown in FIGS. 5, or 7 provide the same benefits.

According to this invention, when a groove is formed on a substrate using a converging ion beam and a junction is formed in the groove portion, an irradiation ion amount of the converging ion beam is varied according to the position of the beam within the groove to thereby shape said groove to a desired configuration, whereby a device having a junction with little variation in characteristics and with high uniformity can be realized.

What is claimed is:

1. A method for fabricating an oxide superconducting device comprising the steps of: forming at least one V-shaped groove on a substrate by a converging ion beam, providing an oxide superconducting thin-film on said V-shaped groove and on said substrate, providing a Josephson Junction by forming a barrier with reduced superconductivity on said oxide superconducting thin-film on said groove, wherein the irradiation ion amount of said converging ion beam is varied within an irradiation plane according to the position of the beam with respect to said groove to thereby shape said groove to a desired configuration.

2. A method for fabricating an oxide superconducting device as claimed in claim 1, wherein said substrate is processed by varying said irradiation ion amount of said converging ion beam according to the position of the beam within said groove in such a manner that a region is formed where an inclination angle of an inclined portion of said V-shaped groove is fixed.

3. A method for fabricating an oxide superconducting device as claimed in claim 1, wherein said substrate is processed by varying said irradiation ion amount of said converging ion beam according to the position of the beam within said groove in such a manner that a curved portion, in which the inclination angle decreases toward the groove periphery, is provided in a region where said V-shaped groove meets the plane surface of the substrate, and that the configuration of the groove is formed by achieving a radius of curvature in the curved portion to cause no grain boundary.

4. A method for fabricating an oxide superconducting device as claimed in claim 1, wherein said substrate is processed by varying said irradiation ion amount of said converging ion beam according to the position of the beam within said groove in such a manner that the inclination angle of one side of said V-shaped groove is acute and the inclination angle of the opposite side is obtuse.

5. A method for fabricating an oxide superconducting device as claimed in claim 1, wherein a plurality of V-shaped grooves are formed.

* * * * *